US009496110B2

(12) United States Patent
Johnson et al.

(10) Patent No.: US 9,496,110 B2
(45) Date of Patent: Nov. 15, 2016

(54) MICRO-ELECTRO-MECHANICAL SYSTEM (MEMS) STRUCTURE AND DESIGN STRUCTURES

(71) Applicant: INTERNATIONAL BUSINESS MACHINES CORPORATION, Armonk, NY (US)

(72) Inventors: Ward A. Johnson, Colchester, VT (US); Jenifer E. Lary, Hinesburg, VT (US); Anthony K. Stamper, Williston, VT (US); Kimball M. Watson, Essex Junction, VT (US); Pui L. Yee, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 406 days.

(21) Appl. No.: 13/920,353

(22) Filed: Jun. 18, 2013

(65) Prior Publication Data

US 2014/0368292 A1 Dec. 18, 2014

(51) Int. Cl.

*H03K 17/22* (2006.01)
*H01H 59/00* (2006.01)
*H01H 57/00* (2006.01)

(52) U.S. Cl.

CPC .... *H01H 59/0009* (2013.01); *H01H 2057/006* (2013.01); *H01H 2059/0054* (2013.01)

(58) Field of Classification Search

CPC ...................................................... H01H 51/22
USPC ............ 335/78; 333/105, 262; 327/517, 565
See application file for complete search history.

(56) References Cited

U.S. PATENT DOCUMENTS

| | | | | |
|---|---|---|---|---|
| 7,256,670 | B2 * | 8/2007 | Jahnes et al. | 335/78 |
| 7,456,713 | B2 * | 11/2008 | Park et al. | 333/262 |
| 7,486,163 | B2 * | 2/2009 | Nielson et al. | 335/78 |
| 8,067,810 | B2 | 11/2011 | Rottenberg et al. | |
| 8,274,324 | B2 * | 9/2012 | Ikehashi | 327/536 |
| 8,368,491 | B2 * | 2/2013 | Pillans et al. | 335/78 |

(Continued)

FOREIGN PATENT DOCUMENTS

| | | |
|---|---|---|
| CN | 1317727 C | 5/2007 |
| CN | 102007559 A | 4/2011 |

(Continued)

OTHER PUBLICATIONS

"Longer MEMS Switch Lifetime Using Novel Dual-Pulse Actuation Voltage" Wong, W.S.H.; Chean Hung Lai Device and Materials Reliability, IEEE Transactions on vol. 9, Issue: 4, Publication Year: 2009, pp. 569-575.

"A GSM/Edge/WCDMA Adaptive Series—LC Matching Network Using RF-MEMS Switches" Van Bezooijen, A.; De Jongh, M.A.; Chanlo, C.; Ruijs, L.; Van Straten, F.; Mahmoudi, R.; Van Roermund, A. Solid-State Circuits, IEEE Journal of vol. 43, Issue: 10, Publication Year: 2008, pp. 2259-2268.

(Continued)

*Primary Examiner* — Dinh T Le

(74) *Attorney, Agent, or Firm* — Anthony Canale; Andrew M. Calderon; Roberts Mlotkowski Safran Cole & Calderon, P.C.

(57) ABSTRACT

Micro-Electro-Mechanical System (MEMS) structures, methods of manufacture and usage, and design structures are disclosed herein. The method includes applying a first voltage polarity to an actuator of a Micro-Electro-Mechanical System (MEMS) structure to place the MEMS structure in a predetermined state for a first operating condition. The method further includes applying a second voltage polarity which is opposite from the first voltage polarity to the actuator of the MEMS structure during a subsequent operating condition.

19 Claims, 5 Drawing Sheets

(56) References Cited

U.S. PATENT DOCUMENTS

| | | | | |
|---|---|---|---|---|
| 8,525,185 | B2 * | 9/2013 | Goldsmith et al. | 257/77 |
| 2006/0125746 | A1 * | 6/2006 | Sallese | H01G 5/16 345/85 |
| 2010/0013725 | A1 | 1/2010 | Lempkowski | |
| 2010/0238600 | A1 | 9/2010 | Miyazaki | |
| 2011/0148948 | A1 | 6/2011 | Gandhi et al. | |
| 2011/0221300 | A1 | 9/2011 | Shimanouchi et al. | |
| 2012/0099171 | A1 | 4/2012 | Yeh et al. | |
| 2012/0193685 | A1 | 8/2012 | Goldsmith et al. | |

FOREIGN PATENT DOCUMENTS

| | | | |
|---|---|---|---|
| CN | 102054628 | A | 5/2011 |
| CN | 102471048 | A | 5/2012 |
| EP | 2107038 | A2 | 10/2009 |
| JP | 2006247820 | | 9/2006 |
| WO | 2007022500 | A2 | 2/2007 |
| WO | 2008087583 | A2 | 7/2008 |

OTHER PUBLICATIONS

“Dielectric Charging of RF MEMS Capacitive Switches under Bipolar Control-Voltage Waveforms” Zhen Peng; Xiaobin Yuan; Hwang, J.C.M.; Forehand, D.I.; Goldsmith, C.L. Microwave Symposium, 2007. IEEE/MTT-S International Publication Year: 2007, pp. 1817-1820.

“Charging in Dielectricless Capacitive RF-MEMS Switches” Mardivirin, D.; Pothier, A.; Crunteanu, A.; Vialle, B.; Blondy, P. Microwave Theory and Techniques, IEEE Transactions on vol. 57, Issue: 1, Publication Year: 2009, pp. 231-236.

“New insights into charging in capacitive RF MEMS switches” Czarnecki, P.; Rottenberg, X.; Soussan, P.; Nolmans, P.; Ekkels, P.; Muller, P.; Tilmans, H.A.C.; De Raedt, W.; Puers, R.; Marchand, L.; De Wolf, I. Reliability Physics Symposium, 2008. IRPS 2008. IEEE International Publication Year: 2008, pp. 496-505.

“Planar MEMS RF Capacitor Integration”, A.K. Stamper et al., IBM, 4 pages. Proc. 16th Procedures. Beijing, China, Jun. 5-9, 2011.

* cited by examiner

MICRO-ELECTRO-MECHANICAL SYSTEM (MEMS) STRUCTURE AND DESIGN STRUCTURES

FIELD OF INVENTION

The invention relates to integrated circuits and, more particularly, to Micro-Electro-Mechanical System (MEMS) structures, methods of manufacture and usage, and design structures.

BACKGROUND

Integrated circuit switches used in integrated circuits can be formed from solid state structures (e.g., transistors) or passive wires (MEMS). MEMS switches are typically employed because of their almost ideal isolation, which is a critical requirement for wireless radio applications where they are used for mode switching of power amplifiers (PAs) and their low insertion loss (i.e., resistance). MEMS switches can be used in a variety of applications, primarily analog and mixed signal applications. One such example is cellular telephone chips containing a power amplifier (PA) and circuitry tuned for each broadcast mode. Other examples include personal computers or electronic pads with WiFi or other wireless capability. Integrated switches on the chip would connect the PA to the appropriate circuitry so that one PA per mode is not required.

In operation, increased actuation bias of an electrostatically actuated MEMS switch accelerates switch degradation via dielectric charging which, in turn, effectively alters the pull-in voltage. Conventional modes of manufacture which try to reduce the dielectric charging have known yield problems, e.g., decreasing a MEMS gap, can decrease yield performance.

Accordingly, there exists a need in the art to overcome the deficiencies and limitations described hereinabove.

SUMMARY

In an aspect of the invention, a method comprises applying a first voltage polarity to an actuator of a Micro-Electro-Mechanical System (MEMS) structure to place the MEMS structure in a predetermined state for a first operating condition. The method further comprises applying a second voltage polarity which is opposite from the first voltage polarity to the actuator of the MEMS structure during a subsequent operating condition.

In an aspect of the invention, a method comprises applying a first voltage polarity to a Micro-Electro-Mechanical System (MEMS) structure. The method further comprises applying a second voltage polarity to a MEMS beam during an OFF state or a subsequent actuated state of the MEMS structure. The first voltage polarity is opposite to the second voltage polarity. The first voltage polarity places the MEMS structure in a data transmission mode. The second voltage polarity is applied after conclusion of the data transmission mode. The second voltage polarity eliminates dielectric charging across the MEMS structure.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the MEMS capacitive switch, which comprises the structures of the present invention. In still further embodiments, a method in a computer-aided design system is provided for generating a functional design model of the MEMS capacitive switch. The method comprises generating a functional representation of the structural elements of the MEMS capacitive switch.

In embodiments, a method in a computer-aided design system for generating a functional design model of a MEMS structure comprises: generating a functional representation of a MEMS beam moveable between an ON state and an OFF state, the MEMS beam comprising a first set of actuators and a capacitor plate within a dielectric material; and generating a functional representation of a second set of actuators and another capacitor plate, which are separated from the first set of actuators and the capacitor plate by an insulator layer. The representations further comprise at least one of the first set of actuators and the second set of actuators being structured and configured to provide a change in polarity of a first voltage in an ON state and a second voltage after the MEMS structure is in a subsequent OFF state.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to Micro-Electro-Mechanical System (MEMS) structures, methods of manufacture and design structures. More specifically, the present invention relates to MEMS capacitive switches, methods of manufacture and usage and related design structures. Advantageously, the present invention significantly reduces or effectively eliminates dielectric charging across the MEMS structure, e.g., MEMS capacitive switch, thereby increasing hold-down lifetime of the MEMS structure. Also, by implementing the operating parameters of the present invention, noise can be eliminated and the MEMS structure, e.g., MEMS capacitive switch, will still benefit from a long term reduction of dielectric charging.

By way of example, the present invention contemplates using bipolar operation of the MEMS capacitive switches. In embodiments, for example, the polarity of the switch can be switched after each use, e.g., after each phone call or other type of data transmission (e.g., voice or data). Alternatively or in addition, a reverse polarity actuation of opposite polarity can be applied to the MEMS capacitive switches for a short period of time after initial actuation is complete. In still further embodiments, a two step actuation approach can be utilized, where a high voltage is applied to actuate the switch, and a lower voltage is applied, after a delay, to operate the switch (maintain hold down).

More specifically, the present invention relates to methods of operating a MEMS capacitive switch during various operating conditions of a device (e.g., cell phone, personal computer, electronic pad, etc.) by applying specific actuation/hold voltages during certain operating conditions of the device (e.g., ON state for first call, OFF state, ON state for second call, etc.). These different operating conditions improve reliability of the MEMS capacitive switch, without adversely affecting the performance of the device. For example, the present invention differs from conventional operating conditions by, for example, applying different actuation/hold voltages after each use (e.g., applying a bipolar actuation/hold voltage during different ON states of the device), amongst other contemplated operating conditions.

Figure 1:
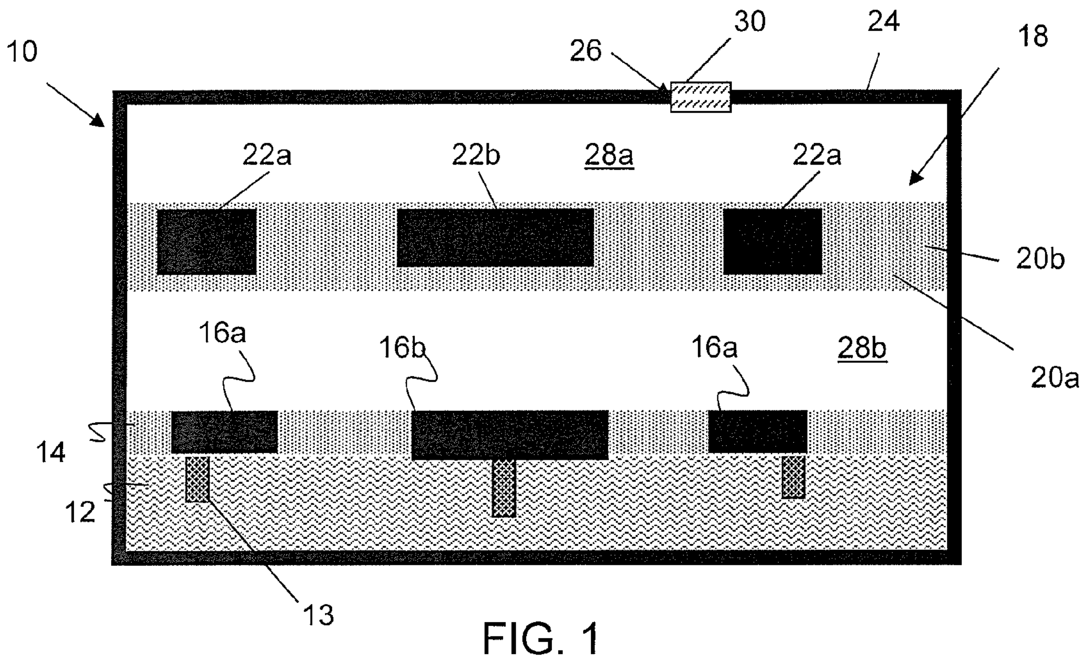
FIG. 1 shows a Micro-Electro-Mechanical System (MEMS) structure and methods of manufacture in accordance with aspects of the present invention.

FIG. 1 shows a Micro-Electro-Mechanical System (MEMS) structure and methods of manufacture in accordance with aspects of the present invention. Depending on the particular application and engineering criteria, the MEMS structure of the present invention comes in many different forms. For example, the MEMS structure can be realized in the form of a cantilever structure. An alternative MEMS structure is a bridge, which has both ends fixed to the wafer. It should also be understood by those of skill in the art that the MEMS structure of FIG. 1 (and FIG. 2) is an illustrative example of MEMS capacitance bridge switches which can implement the operating parameters of the present invention. Accordingly, other MEMS structure configurations are also contemplated by the present invention.

It should be further understood by those of skill in the art that the MEMS switches and other passive and active components of the present invention can be manufactured in a number of ways using a number of different tools. In general, though, the methodologies and tools are adopted from integrated circuit (IC) technology to form small structures with dimensions in the micrometer scale with switch dimensions of approximately 5 microns thick, 50 microns wide, and 200 microns long. For example, the structures of the present invention, e.g., MEMS beam, plates, actuators, etc., are built on wafers and are realized in films of materials patterned by photolithographic processes. In particular, the fabrication of the structures uses three basic building blocks: (i) deposition of films of material on a substrate, (ii) applying a patterned mask on top of the films by photolithographic imaging, and (iii) etching the films selectively to the mask.

More specifically, as shown in FIG. 1, the MEMS structure 10 of the present invention includes a substrate 12. In embodiments, the substrate 12 can be any layer of a device, composed of an oxide or other insulator material known to those of skill in the art. As should be understood by those of skill in the art, the substrate 12 can be implemented in either an SOI wafer or BULK implementation, or could be an insulating substrate such as sapphire or silica glass. The constituent materials of the SOI wafer or BULK implementation may be selected based on the desired end use application of the semiconductor device. For example, the insulation layer, e.g., BOX, may be composed of oxide, such as $SiO_2$. Moreover, the active semiconductor layer can be comprised of various semiconductor materials, such as, for example, Si, SiGe, SiC, SiGeC, etc. The SOI wafer may be fabricated by conventional processes including, but not limited to, oxygen implantation (e.g., SIMOX), wafer bonding, etc.

Still referring to FIG. 1, an interconnect 13 is provided within the substrate 12. The interconnect 13 can be, for example, a tungsten or copper stud formed in a conventionally formed via. For example, the interconnect 13 can be foamed using any conventional lithographic, etching and deposition processes, known to those of skill in the art for forming studs. A wiring layer is formed on the substrate 12 to foam multiple wires, e.g., actuators 16*a* (fixed electrodes) and a plate structure 16*b* (for a capacitor switch). An insulator material 14 is formed on the actuators 16*a* and plate structure 16*b* and exposed portions of the substrate 12. The insulator material 14 can be, for example, an oxide material (e.g., $S_iO_2$), which is subjected to a chemical mechanical polishing (CMP) to expose a surface of the actuators 16*a* and plate structure 16*b*.

In embodiments, the actuators 16*a* and a plate structure 16*b* can be fabricated from a metal or metal alloy using known CMOS fabrication processes (e.g., using an additive or subtractive metal process). In embodiments, the metal or metal alloy can be deposited using conventional deposition processes such as, for example, atomic layer deposition (ALD), metal sputtering, or a chemical vapor deposition (CVD), amongst other deposition methods. For example, a wiring layer can be deposited on the substrate 12 to a depth of about 0.25 microns; although other dimensions are contemplated by the present invention. Thereafter, the wiring layer is patterned to form the actuators 16*a* (fixed electrodes) and plate structure 16*b*. The patterning can be performed using conventional lithography and etching processes, known to those of skill in the art. At least one of the actuators 16*a* is fabricated in contact (direct electrical contact) with the interconnect 13.

In embodiments, the actuators (fixed electrodes) 16*a* and plate structure 16*b* can be formed from aluminum; although other wiring materials are also contemplated by the present invention. For example, the actuators 16*a* and plate structure 16*b* can be a refractory metal such as Ti, TiN, TaN, Ta, and W, or AlCu, AlCuSi, or Cu, CuMn, amongst other wiring materials. In embodiments, the actuators 16*a* and plate structure 16*b* could be cladded with Ti and capped with an antireflective layer TiN, e.g., Ti/Al/Ti/TiN; or cladded in Ta or TaN. The insulator material 14 is formed on the actuators 16*a* and plate structure 16*b* and exposed portions of the substrate 12 using conventional deposition processes, e.g., chemical vapor deposition (CVD) or plasma enhanced CVD (PECVD).

A MEMS beam 18 can be fabricated using conventional lithography, deposition and etching processes. In embodiments to fabricate the MEMS beam 18, for example, a sacrificial material (e.g., silicon or other selective material) is formed on the exposed portions of the insulator material 14, actuators 16*a* and plate structure 16*b*. In embodiments, an insulator material 20*a* is deposited on the sacrificial material using conventional deposition processes, e.g., CVD.

The insulator material 20*a* can be any insulator material such as oxide based materials, which will form a MEMS capacitor dielectric. Also, it should be understood by those of skill in the art that the insulator layer 20*a* will prevent shorting of the actuators (fixed electrodes) 16*a* and actuators (suspended electrodes) 22*a*, when the switch is activated.

Also, as described herein, any combination of the actuators (fixed electrodes) 16*a* and actuators (suspended electrodes) 22*a* are structured and configured to provide a change in polarity of a first voltage in an ON state and a second voltage after the MEMS structure is in a subsequent OFF state.

Similar to the actuators 16*a* and plate structure 16*b*, actuators (suspended electrodes) 22*a* and an upper plate structure 22*b* can be formed on the insulator material 20*a*. The actuators 22*a* and an upper plate structure 22*b* can be made from the same or similar materials as the actuators 16*a* and plate structure 16*b* using similar or same lithography, deposition and etching processes as described herein. In alternate embodiments, the actuators 22*a* and upper plate structure 22*b* (and/or actuators 16*a* and plate structure 16*b*) can be TiN, TiN or W, Ru, Pt, Ir, amongst other materials.

The thicknesses of this and other electrodes and/or wires can vary depending on the specific design parameters. For example, Ti/AlCu/Ti/TiN layers could be used with 10 nm, 5000 nm, 10 nm, and 32 nm thickness, respectively, which would foam $TiAl_3$ under and over the AlCu after 400° C. annealing. Alternatively, the actuators 22*a* and upper plate structure 22*b* (and/or actuators 16*a* and plate structure 16*b*) could be formed from a noble metal, such as Au; or a refractory metal, such as W or Ta; or without a Ti—AlCu interface, e.g., Ti/TiN/AlCu/TiN. Alternatively, the conductors in the beam 18 could be formed with two or more wiring levels, connected by vias as is known in the art.

In any of the embodiments, an insulator layer 20*b* can then be formed over the actuators 22*a* and an upper plate structure 22*b*. In optional embodiments, the insulator layer 20*b* can embed the actuators 22*a* and upper plate structure 22*b* therein, or alternatively, can undergo a CMP process to expose surfaces of the actuators 22*a* and upper plate structure 22*b*. In embodiments, the insulator layer 20*b* can undergo a planarization process prior to the deposition of another sacrificial material on its surface.

After formation of another sacrificial material on the insulator layer 20*b*, an insulator (oxide) material 24 can be deposited on the sacrificial material to form a lid. In embodiments, the insulator material 24 can be deposited to a thickness of about 5 μm or more, and can be deposited using any conventional CVD process. The insulator material 24 can be planarized, partially planarized or left unplanarized. In embodiments, a vent hole 26 is patterned and opened in the lid 24, exposing a portion of the underlying sacrificial material. The sacrificial layers are vented or stripped by way of the vent hole(s) 26 to form an upper cavity 28*a* and lower cavity 28*b* about the MEMS beam 18. In embodiments, the structure, and in particular, the exposed underlying sacrificial material can be cleaned with an HF solution prior to venting to remove the native oxide. In embodiments, the stripping (e.g., venting) can be performed using a $XeF_2$ etchant chemistry through the vent hole(s) 26. The vent hole 26 can be sealed with a material 30, such as a dielectric or metal.

Figure 2:
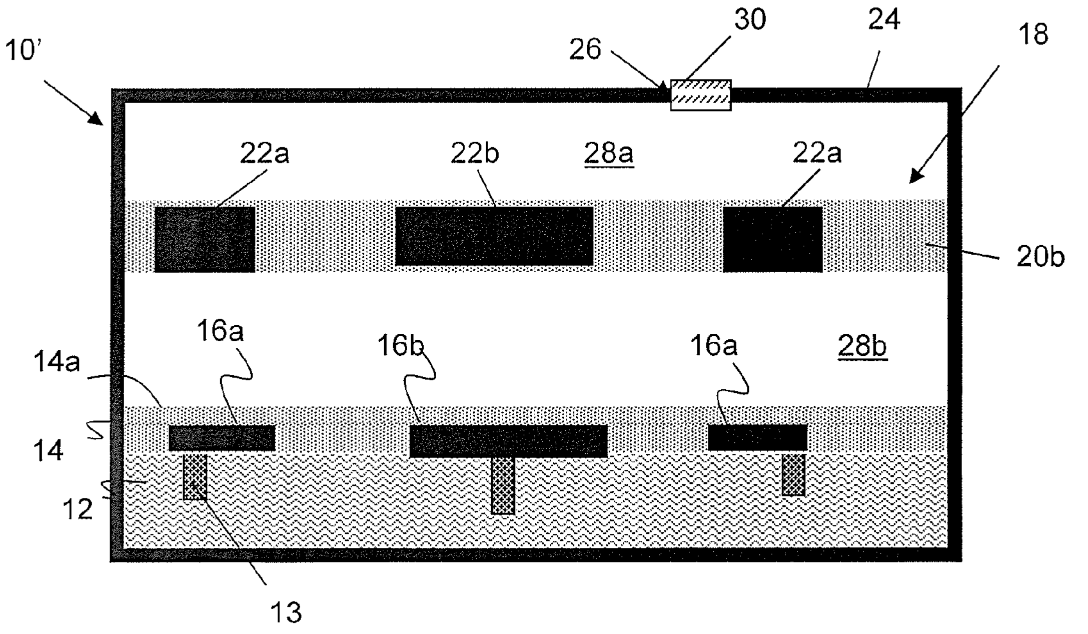
FIG. 2 shows a MEMS structure and methods of manufacture in accordance with additional aspects of the present invention.

FIG. 2 shows a MEMS structure and methods of manufacture in accordance with additional aspects of the present invention. In particular, in the embodiment shown in FIG. 2, the structure 10' includes a dielectric material 14*a* over the actuators 16*a* and plate structure 16*b* (for a capacitor switch). As should be understood by those of skill in the art, the dielectric material 14*a* can be a MEMS capacitor dielectric. Also, as should further be understood by those of skill in the art, the dielectric material 14*a* can be formed on any combination of the MEMS beam 18 or the insulator material 14. For example, dielectric material 14*a* can be provided only on the plate structure 16*b*; whereas, the insulator layer 20*a* (shown in FIG. 1) can be provided on the actuators 22*a* (or vice versa). Also, it should be understood by those of skill in the art that the insulator layer 20*a* or the dielectric material 14*a* can prevent shorting between the actuators 16*a* and 22*a*.

Figure 3A:
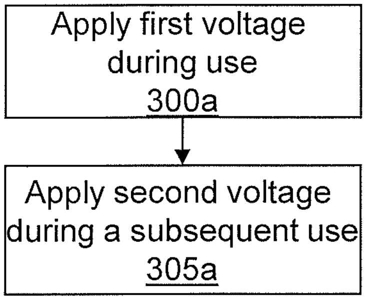
FIG. 3*a*-3*c* show various flows of operating parameters contemplated by aspects of the present invention, and which can be implemented in the MEMS structures of FIGS. 1 and 2, amongst other MEMS structures.
Figure 3B:
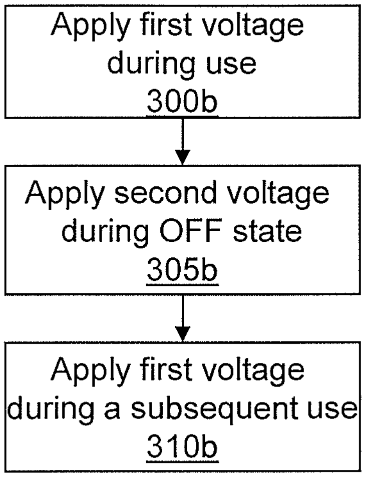
Figure 3C:
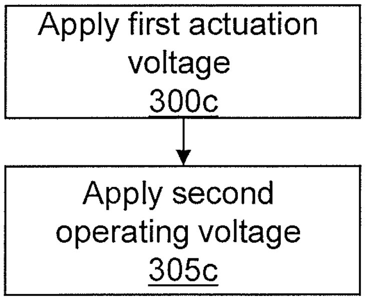

FIGS. 3*a*-3*c* show various flows of operating parameters contemplated by aspects of the present invention, and which can be implemented in the MEMS structures of FIGS. 1 and 2, amongst other MEMS structures. In embodiments, the logic of the MEMS structures or any circuitry of the chip can be programmed to meet these operating parameters, e.g., by applying different actuation voltages as described in any of FIGS. 3*a*-3*c*. This can be accomplished by sensing or determining the polarity of the actuation voltage during use, and applying different actuation voltages using any of the operating schemes of the present invention. The operating parameters of the present invention can be implemented in software and/or hardware as would be understood by those of skill in the art such that no further explanation is required. In embodiments, timers known to those of skill in the art can also be implemented during implementation of the operating parameters, as should be understood by those of skill in the art.

More specifically, the present invention provides an event based reversal of the polarity of the actuation voltage of electrostatically actuated MEMS switches. For example, the present invention can reverse actuator polarity between phone calls, data transmissions, or other communications, e.g., between different states or operating conditions, e.g., voice, calls, data transmission etc., any of which can be used interchangeably herein. In this way, it is possible to reverse actuator polarity before or after active (or unplanned) communication between two devices. For example, reversal of the actuator polarity is possible before or after active communication, not predetermined by a protocol between two devices, e.g., handshaking and other regularly occurring exchanges of information used for things like broadcasting an SSID or cellular handover in mobile phone networks.

Referring to FIGS. 3*a*-3*c*, in operation of either the MEMS structures of FIG. 1 or FIG. 2, a voltage is applied to one or more of the actuators 16*a* and 22*a* to pull-down the MEMS beam 18. The voltage required to pull the MEMS beam 18 (e.g., suspended electrodes 22*a*) to the fixed electrode (e.g., actuators 16*a*) by electrostatic force is called pull-in voltage, which is dependent on several parameters including the length of the MEMS beam 18, spacing or gap between the suspended electrodes 22*a* and fixed electrodes 16*a*, and spring constant of the MEMS beam 18, which is a function of the materials and their thickness. In any scenario, dielectric charging begins once an electrical potential, i.e., pull-in voltage, is placed across the MEMS actuators 16*a*, 20*a*. That is, application of a voltage will result in (i) dielectric charging of the dielectric layer 20*a* under the fixed electrodes 16*a* (FIG. 1) and/or (ii) dielectric charging of the dielectric layer 14*a* over the fixed electrodes 16*a* (FIG. 2). This dielectric charging will effectively alter the pull-in voltage and, in turn, result in a degradation of the MEMS capacitive switch. In fact, dielectric charging can result in actuation failure.

To significantly increase the pull-down lifetime of the MEMS structures of FIG. 1 and FIG. 2 (or any combination thereof), the present invention contemplates different operating conditions, e.g., pull-down voltage schemes, which significantly reduce or effectively eliminate dielectric charging of the dielectric materials. By way of brief explanation, in the case the MEMS structure of FIG. 1 and FIG. 2 is used for impedance matching of a cellular telephone antenna, it is possible to reap the benefits of bipolar operation while avoiding the noisy side effects by maintaining a single polarity during operation and then reversing it for each consecutive use; that is, each phone call (or other data transmission) will use the opposite polarity of a preceding or subsequent call.

More specifically, in a first mode of operation, the present invention contemplates a bipolar switching scheme, which eliminates a long period of unipolar DC electric fields across the MEMS dielectric. For example, in a telephone application, the voltage is switched from a first polarity (positive) to a second polarity (negative) or vice versa, after each call, data transmission, hand shake, etc. More specifically, referring to FIG. 3*a*, the present invention contemplates a method for operating a MEMS capacitive switch which comprises: (i) applying an actuation (and hold) voltage having a first polarity (positive) during an entire time period of a first operating condition of a device (ON state for a first phone call or data transfer) (step 300*a*); and, (ii) after the first operating condition has completed (e.g., after an OFF state), applying an actuation (and hold) voltage having a second polarity (negative) opposite to the first polarity during an entire time period of a second operating condition of the device (e.g., ON state for a second phone call or data transfer) (step 305*a*). In this way, the use of different polarities will effectively balance unipolar operation.

By way of implementing the operating parameters of FIG. 3*a*, for example, the MEMS beam actuator plate (actuator 22*a*) can be biased positively vs. the reference bottom actuator plate (actuator plate 16*a*). In embodiments, the polarity can be reversed by either: (i) biasing the MEMS beam actuator plate (actuator 22*a*) negatively vs. the reference bottom actuator plate (actuator plate 16*a*), e.g., +40 vs. 0 V becomes −40 vs. 0 V, or (ii) switching the potentials between the two terminals (e.g. +40 vs. 0 V becomes 0 vs. +40 V). It is also noted that if both terminals are defined as relative to a third reference, it is possible to repeat (i) by using a third method (iii), with +20 vs. −20 V becoming −20 vs. +20 V, as an example. Also, in embodiments, the first method (i) may require shifting one terminal by twice its potential in the opposite direction; whereas, the second method (ii), may require rerouting the voltage paths between the terminals, exchanging one source for the other. The third method (iii) may require shifting both terminals by twice their potentials in opposite directions.

As an additional approach to significantly increase the pull-down lifetime of the MEMS structures of FIG. 1 and FIG. 2 (or any combination thereof), the present invention contemplates applying a first actuation voltage of a first polarity (positive) during an entire time period of a first operating condition of a device and, after the first operating condition has completed, applying a second actuation voltage having a second polarity (negative) for at least an amount of time to substantially discharge the MEMS capacitor. More specifically, referring to FIG. 3*b*, the present invention contemplates a method for operating a MEMS capacitive switch which comprises: (i) applying an actuation (and hold) voltage having a first polarity (positive) during an entire time period of a first operating condition of a device (ON state for a first phone call or data transfer) (step 300*b*); (ii) after the first operating condition has completed, applying an actuation (and hold) voltage having a second polarity (negative) opposite to the first polarity for at least an amount of time to substantially discharge the MEMS capacitor during a second operating condition of the device (OFF state) (step 305*b*); and, after the second operating condition has completed (OFF state), applying an actuation (and hold) voltage having the first polarity (positive) during an entire time period of a third operating condition of the device (e.g., ON state for a second phone call or data transfer) (step 310*b*). These steps can be repeated.

As an additional approach to significantly increase the pull-down lifetime of the MEMS structures of FIG. 1 and FIG. 2 (or any combination thereof), the present invention contemplates applying a first actuation voltage to actuate the MEMS structure and a lower operating voltage to maintain an ON state of the device. That is, once pull-in voltage has been achieved, relaxation of the actuation voltage can be provided without releasing the MEMS beam 18 from the closed position. This decrease in voltage will, in turn, decrease the rate of dielectric charging. That is, once the MEMS beam 18 has actuated, the voltage across the actuators can decrease enough to increase the lifetime of the switch, but not so far as to release the MEMS beam 18 from contact with the floor of the cavity, e.g., actuator 16*a.*

More specifically, referring to FIG. 3*c*, the present invention contemplates a method for operating a MEMS capacitive switch which comprises: (i) applying an actuation voltage across the MEMS switch, e.g., actuation voltage of 40V (step 300*c*), and (ii) after a predetermined amount of time, e.g., about 2× switching time, during operation of the MEMS capacitive switch, applying a lower hold down voltage across the MEMS switch, e.g., hold voltage ($V_{hold}$) of 25V (step 305*c*). In embodiments, the switching time can be about 20 μs such that the predetermined time period can be about 40 μs to 50 μs. Advantageously, this operating method does not produce rf noise, and does not require additional structures or changes to the device design.

Figure 4:
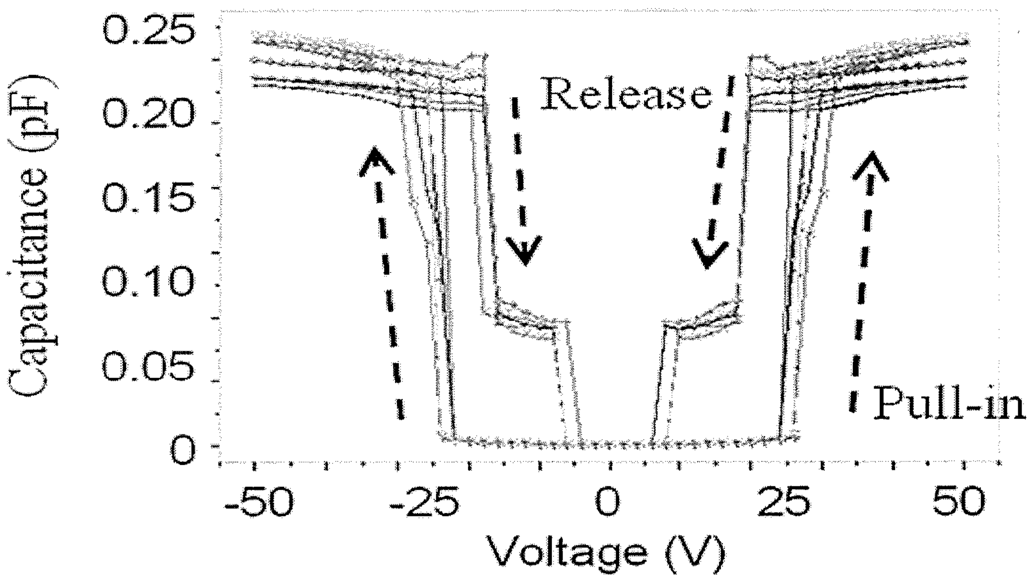
FIG. 4 shows a plot of ramp down voltage implementing the operating parameters of FIG. 3*c*, in accordance with aspects of the present invention.

FIG. 4 shows a plot of capacitance while the potential across the actuators ramps from 0 to +50 to −50 to 0 V, implementing the operating parameters of FIG. 3*c* in accordance with aspects of the present invention. In the plot of FIG. 4, the Y-axis is in units of picofarads (pF) and the X-axis is in voltages. In this example, it is shown that it is possible to ramp down the voltage to hold down the MEMS beam 18, as described in FIG. 3*c*. For example, it is possible to ramp down the voltage to about 25V, while still maintaining the MEMS beam 18 in a lowered position, e.g., ON state. Thus, it is possible to reduce the electrostatic field across the actuators once the actuators have been actuated, e.g., during operation, thereby reducing the dielectric charging.

Figure 5:
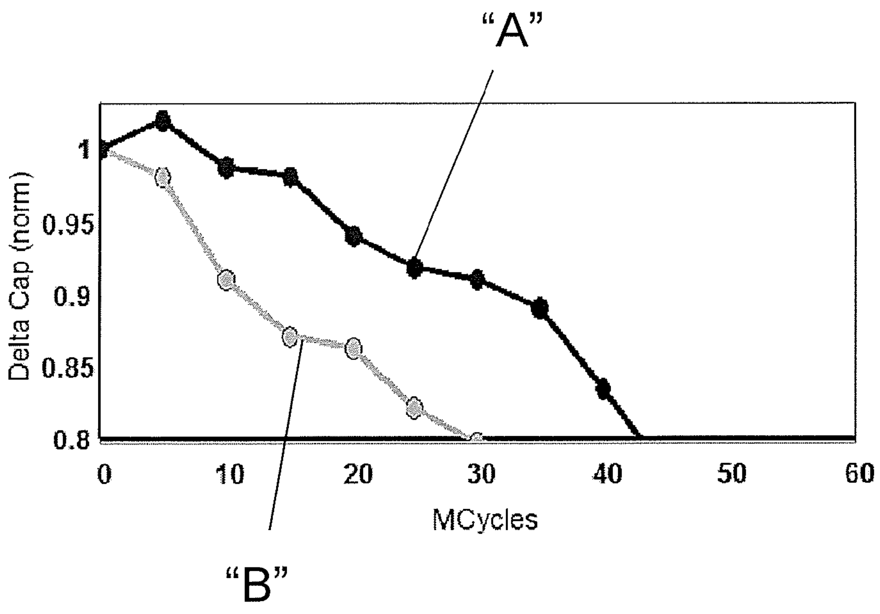
FIG. 5 shows a graph comparing MEMS structures using different operating voltages.

FIG. 5 shows a graph comparing the cycling of MEMS structures using different operating voltages. The actuation voltage for a MEMS is defined as the voltage used to cause the MEMS beam to pull-in and be in a high capacitance state. MEMS cycling comprises applying 0V, actuation voltage, 0V, actuation voltage, etc. such that the actuation voltage is applied for sufficient time for the MEMS beam to actuate. In one example, the actuation voltage is applied for about 40 micro seconds. Cycling lifetime is defined as the number of cycles required to change the delta capacitance, 0V capacitance, or actuation voltage capacitance by a fixed amount or percentage, such as 5%.

More specifically, FIG. 5 shows an increase of cycle lifetime with use of a lower pull-down voltage. For example, line “A” represents an operating voltage of 35V; whereas, line “B” represents an operating voltage of 40V. As thus shown, by applying a smaller voltage, pull-down lifetime can increase by a factor of 1.5× cycles or more. Accordingly, this shows that operating parameters of the MEMS capacitive switch of FIG. 3*c*, for example, can increase switch lifetime, by applying a lower voltage.

Figure 6:
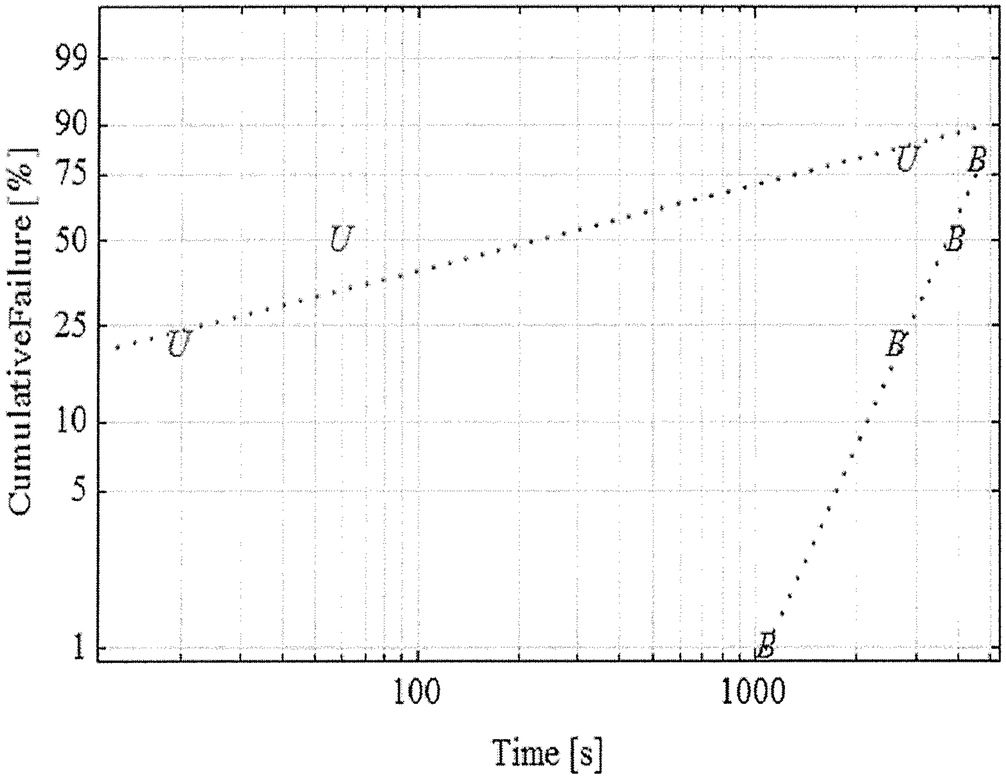
FIG. 6 shows a graph of hold down lifetime of unipolar operation compared to bipolar operation.

FIG. 6 shows a graph of hold down lifetime of unipolar operation compared to a bipolar operation. More specifically, FIG. 6 shows a cumulative failure rate of a unipolar (U) operation compared to a bipolar (B) operation. As shown, a bipolar operation significantly decreases fail rates over cycle times. This graph can be applicable to the operations shown in FIGS. 3*a* and 3*b*, for example.

Figure 7:
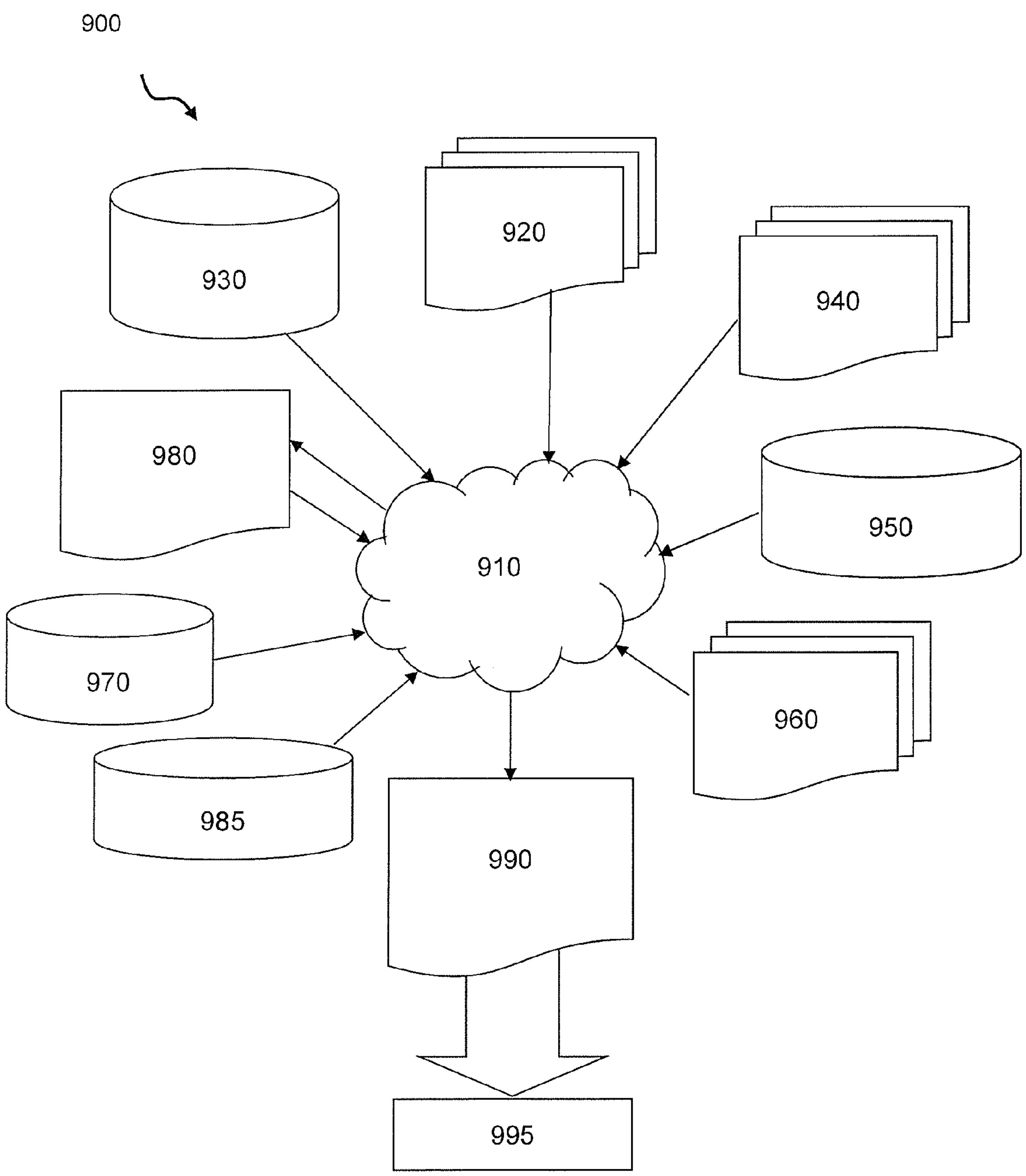
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1 and 2. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Thus, the design structures can be provided in a computer program product comprising a computer readable storage medium having stored/encoded thereon. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1 and 2. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1 and 2 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g.

information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 2. In one embodiment, design structure 990 may comprise a compiled, executable HDL simulation model that functionally simulates the devices shown in FIGS. 1 and 2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 2. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:

applying a first voltage of a single polarity to an actuator of a Micro-Electro-Mechanical System (MEMS) structure to place the MEMS structure in a predetermined state for a first operating condition, wherein the first voltage of the single polarity is an actuation voltage applied during a first ON state; and applying a second voltage of a single polarity which is opposite from the polarity of the first voltage to the actuator of the MEMS structure during a subsequent operating condition, wherein the second voltage of the single polarity is an actuation voltage applied during a subsequent ON state.

2. The method of claim 1, wherein the first operating condition is transmission of data.

3. The method of claim 1, wherein:

the first voltage of the single polarity is applied until the first operating condition of a device is discontinued; and the second voltage of the single polarity is applied during an entire time period of the subsequent operating condition of the device.

4. The method of claim 1, wherein the first ON state and the subsequent ON state correspond to when either a respective phone call or data transmission is taking place.

5. The method of claim 1, wherein the second voltage of the single polarity balances unipolar operation.

6. The method of claim 1, wherein the first voltage of the single polarity is applied during an ON state and the second voltage of the single polarity is applied during an OFF state.

7. The method of claim 6, further comprising applying the first voltage of the single polarity during a subsequent ON state, wherein the first voltage of the single polarity is applied during an entire time period of the first operating condition and the subsequent operating condition and, after the first operating condition has completed, the second voltage of the single polarity is applied to substantially discharge a MEMS capacitor during an OFF state.

8. The method of claim 7, wherein the applying of the second voltage of the single polarity is applied for a predetermined amount of time.

9. The method of claim 8, wherein the predetermined amount of time is about 1 minute.

10. The method of claim 1, wherein:

the first operating condition comprises applying a two step voltage; and the second operating condition comprises applying another two step voltage.

11. The method of claim 10, wherein:

an absolute value of a first voltage is greater than an absolute value of a second voltage of the two step voltage of the first operating condition; and an absolute value of the second voltage of the single polarity is greater than an absolute value of the another two step voltage of the second operating condition.

12. A method comprising:

applying a first voltage of a single polarity to a Micro-Electro-Mechanical System (MEMS) structure;

applying a second voltage of a single polarity to a MEMS beam during an OFF state or a subsequent actuated state of the MEMS structure, wherein:

the polarity of the first voltage of the single polarity is opposite to the polarity of the second voltage of the single polarity;

the first voltage of the single polarity places the MEMS structure in a data transmission mode;

the second voltage of the single polarity is applied after conclusion of the data transmission mode; and the second voltage of the single polarity reduces dielectric charging across the MEMS structure.

13. The method of claim 12, wherein second voltage of the single polarity is applied in an OFF state of the MEMS structure.

14. The method of claim 12, wherein the second voltage of the single polarity balances unipolar operation of the MEMS structure.

15. The method of claim 12, wherein the second voltage of the single polarity is applied for a predetermined amount of time during an OFF state of the MEMS structure.

16. The method of claim 15, wherein the predetermined amount of time is about 1 minute.

17. The method of claim 12, wherein:

applying first voltage of the single polarity comprises applying a two step voltage, where an absolute value of a first voltage is greater than an absolute value of a second voltage of the two step voltage; and applying the second voltage of the single polarity comprises applying another two step voltage, where an absolute value of a first voltage is greater than an absolute value of a second voltage of the another two step voltage.

18. The method of claim 12, wherein the first voltage of the single polarity is applied during an entire time of actuation and the & second voltage of the single polarity is applied during an entire time of the subsequent actuated state of the MEMS structure.

19. A non-transitory machine-readable medium including sequences of instructions, the sequences of instructions including instructions which when executed causes a machine to perform a method comprising:

generating a functional representation of a MEMS beam moveable between an ON state and an OFF state, the MEMS beam comprising a first set of actuators and a capacitor plate within a dielectric material; and generating a functional representation of a second set of actuators and another capacitor plate, which are separated from the first set of actuators and the capacitor plate by an insulator layer, wherein the representations further comprise at least one of the first set of actuators and the second set of actuators being structured and configured to provide a change in polarity of a first voltage in an ON state and an a second voltage after the MEMS structure is in a subsequent OFF state.

* * * * *